United States Patent [19]

Ogawa et al.

[11] Patent Number: 5,534,092

[45] Date of Patent: Jul. 9, 1996

[54] METHOD OF MANUFACTURING MULTILAYER CERAMIC ELECTRONIC COMPONENT

[75] Inventors: Mamoru Ogawa; Tatsuya Todo; Miyuki Mizukami, all of Kyoto, Japan

[73] Assignee: Murata Manufacturing Co., Ltd., Japan

[21] Appl. No.: 283,948

[22] Filed: Aug. 1, 1994

[30] Foreign Application Priority Data

Aug. 5, 1993 [JP] Japan .................................. 5-194864

[51] Int. Cl.⁶ .............................. B32B 31/20; B32B 31/26
[52] U.S. Cl. .................................. 156/89; 264/61; 264/65
[58] Field of Search ............................... 156/89; 264/61, 264/65

[56] References Cited

U.S. PATENT DOCUMENTS

| | | | |
|---|---|---|---|
| 5,141,899 | 8/1992 | Jean et al. | 156/89 X |
| 5,174,842 | 12/1992 | Hamuro et al. | 156/89 |
| 5,261,986 | 11/1993 | Kawabata et al. | 156/89 X |
| 5,370,760 | 12/1994 | Mori et al. | 156/89 |

FOREIGN PATENT DOCUMENTS

| | | |
|---|---|---|
| 63-176147 | 7/1988 | Japan . |
| 5-175072 | 7/1993 | Japan . |
| 5-347228 | 12/1993 | Japan . |

*Primary Examiner*—David A. Simmons
*Assistant Examiner*—M. Curtis Mayes
*Attorney, Agent, or Firm*—Ostrolenk, Faber, Gerb & Soffen

[57] ABSTRACT

In order to suppress deviation of conductor films and to effectively remove voids when a laminate obtained by stacking a plurality of ceramic green sheets provided with the conductor films is pressed in the direction of stacking, a pressing step is divided into a preliminary pressing step and a main pressing step which is carried out subsequently thereto. In the preliminary pressing step, a temperature of at least 40° C. is applied to the laminate of the plurality of ceramic green sheets by a heater, while a press head is driven toward the laminate, thereby applying a pressure of not more than 50 kgf/cm² to the same. The preliminary pressing step may be further divided into first and second preliminary pressing steps. In the first preliminary pressing step, the laminate is pressed by a press surface having projections on regions corresponding to those provided with the conductor films, so that voids are removed from the regions provided with the conductor films. In the second preliminary step, the laminate is pressed by a press surface having projections on regions corresponding to those provided with no conductor films, so that at least the regions provided with no conductor films are pressed.

14 Claims, 2 Drawing Sheets

5,534,092

METHOD OF MANUFACTURING MULTILAYER CERAMIC ELECTRONIC COMPONENT

BACKGROUND OF THE INVENTION

1. Field of the Invention

The present invention relates to a method of manufacturing a multilayer ceramic electronic component, and more particularly, it relates to an improvement of a pressing step which is applied to an unfired laminate formed by stacking a plurality of ceramic green sheets with each other.

2. Description of the Background Art

Among multilayer ceramic electronic components, a multilayer ceramic capacitor, for example, is typically manufactured through the following steps:

First, a plurality of ceramic green sheets are prepared. Then, conductor films for serving as internal electrodes are formed on specific ones of the ceramic green sheets. These conductor films are formed by applying metal paste onto the ceramic green sheets by printing. Then, the metal paste is dried and the plurality of ceramic green sheets are stacked with each other, so that the laminate as obtained is pressed in the direction of stacking.

The aforementioned laminate is generally planned to be cut in advance of firing, so that a plurality of chips for forming multilayer ceramic capacitors are taken out. In the aforementioned step of forming the conductor films for serving as internal electrodes, therefore, the conductor films are distributed in a plurality of portions of each ceramic green sheet.

The laminate as pressed is then cut as described above to obtain a plurality of chips, which in turn are fired. External electrodes are applied to each of the chips as fired, thereby providing a desired multilayer ceramic capacitor.

However, the pressing step included in the aforementioned method of manufacturing a multilayer ceramic capacitor may often result in a laminate 1 which is in a situation shown in FIG. 2. While conductor films 2 for serving as internal electrodes must be aligned with each other in the laminate 1 along the direction of stacking, the same tend to deviate along the outer peripheral direction of the laminate 1 in a central portion of the laminate 1 along its thickness upon pressing. Such deviation of the conductor films 2 is accumulated toward outer peripheries of the laminate 1, leading to relatively large deviation in those of the conductor films 2 which are in proximity to the outer peripheries of the laminate 1.

The aforementioned deviation of the conductor films 2 leads to such inconvenience that the multilayer ceramic capacitor as obtained is dispersed in capacitance and no desired capacitance can be obtained. Further, a gap 3 between adjacent sets of the conductor films 2 shown in FIG. 2 is so reduced that a cutting line may undesirably pass through the conductor films 2 in the cutting step following the pressing step, to cause inconvenience of defective cutting.

In addition, it may be difficult to apply a press action on regions around the conductor films provided in the laminate due to presence of the conductor films, and hence the ceramic sheets may be insufficient in adhesive strength in these regions. This may result in a problem of delamination in the subsequent steps or the products as obtained. This problem of delamination is particularly remarkable in a laminate formed by a large number of conductor films which are stacked with each other.

When the plurality of ceramic green sheets are stacked with each other, further, air may be entrained between these green sheets, to result in voids. While such voids must be removed through the pressing step, some may occasionally remain after the pressing step. Such voids particularly remarkably remain when the number of the stacked conductor films exceeds 30, for example. The voids remaining through the pressing step are brought into the finally obtained multilayer ceramic electronic component as such, since the voids are not removed in the subsequent steps. As the result, the multilayer ceramic electronic component encounters problems of delamination, reduction in moisture resistance, deterioration of electric characteristics and the like.

SUMMARY OF THE INVENTION

Accordingly, an object of the present invention is to provide a method of manufacturing a multilayer ceramic electronic component, which can solve the aforementioned various problems.

The present invention is directed to a method of manufacturing a multilayer ceramic electronic component comprising the steps of stacking a plurality of ceramic green sheets provided with conductor films, pressing the laminate as obtained in the direction of stacking, and thereafter firing the same. In order to solve the aforementioned technical problems, the present invention aims at improving the pressing step. The feature of the present invention resides in that the pressing step includes a preliminary pressing step and a main pressing step which is carried out subsequently thereto, and the preliminary pressing step is adapted to press a major surface of the laminate under conditions of at least 40° C. and not more than 50 kgf/cm$^2$.

The main pressing step is adapted to apply a pressure of 900 to 2500 kgf/cm$^2$. The temperature in the main pressing step is selected in a range of the room temperature to about 70° C.

According to the present invention, the pressing step is divided into the preliminary and main pressing steps, whereby it is possible to attain preliminary bonding between the ceramic green sheets for inhibiting the conductor films from undesired deviation which may be caused in the main pressing step. Further, the preliminary pressing step is adapted to further improve adhesion between the ceramic green sheets to be attained in the main pressing step.

In order to serve the aforementioned functions, the pressing conditions in the preliminary pressing step are selected to be at least 40° C. and not more than 50 kgf/cm$^2$, as described above. The temperature condition is selected to be at least 40° C., since no effect of preliminary pressing is attained if the temperature is less than 40° C. On the other hand, the pressure condition is selected to be not more than 50 kgf/cm$^2$, since inconvenience is caused equivalently to a case of carrying out only the main pressing step through no preliminary pressing step if the pressure exceeds 50 kgf/cm$^2$. Preferably, the temperature condition is selected in a range of 40° to 80° C. and the pressure condition is selected in a range of 5 to 30 kgf/cm$^2$ in the aforementioned preliminary pressing step. Further, the time for carrying out the preliminary pressing step is preferably selected in a range of 10 to 60 seconds.

Thus, according to the present invention, it is possible to suppress deviation of the conductor films provided in the laminate as pressed by carrying out the preliminary pressing step under the aforementioned conditions in advance of the main pressing step. When the present invention is applied to a method of manufacturing a multilayer ceramic capacitor, therefore, it is possible to reduce dispersion in capacitance as well as to further improve the capacitance in the multilayer ceramic capacitor as obtained. When a cutting step is carried out between the pressing step and the firing step, it is possible to reduce occurrence of defective cutting. This is particularly effective for manufacturing a miniature multilayer ceramic capacitor.

According to the present invention, further, voids which may remain between the ceramic green sheets are removed and adhesion strength between the ceramic green sheets is improved, whereby it is possible to suppress occurrence of delamination. This is particularly effective for manufacturing a multilayer ceramic electronic component having a large number of conductor films which are stacked with each other, such as a multilayer ceramic capacitor having a high capacitance, for example.

The aforementioned voids can be removed during the preliminary pressing step. Therefore, it is not necessary to positively perform vacuum deaeration, for example, for removing such voids, and hence a press machine is not complicated in structure.

Preferably, the preliminary pressing step includes a first preliminary pressing step and a second preliminary pressing step which is carried out subsequently thereto. In the first preliminary pressing step, regions of the laminate provided with the conductor films are mainly pressed so that voids are removed from these regions. In the subsequent second preliminary pressing step, at least regions of the laminate provided with no conductor films are pressed.

Thus, the preliminary pressing step is divided into first and second preliminary pressing steps, so that pressing conditions in the respective preliminary pressing steps differ from each other. Due to the first preliminary pressing step, adhesion between the ceramic green sheets is improved in the regions provided with the conductor films, while voids are removed or may be moved to regions provided with no conductor films. In the subsequent second preliminary pressing step, the voids which are moved to the regions provided with no conductor films are removed. The voids will not return to the regions provided with the conductor films, since these regions are improved in adhesion in the aforementioned first preliminary pressing step. Further, the ceramic green sheets are improved in adhesion through the second preliminary pressing step also in the regions provided with no conductor films, whereby the ceramic green sheets are improved in adhesion along the overall regions thereof as the result. Also in a case of obtaining a multilayer ceramic electronic component having a large number of conductor films which are stacked with each other, therefore, it is possible to suppress occurrence of delamination, prevent reduction in moisture resistance and improve electric characteristics such as a capacitance.

More preferably, the laminate is pressed by a press surface having projections on regions corresponding to those provided with the conductor films in the first preliminary pressing step. In the second preliminary pressing step, further, the laminate is more preferably pressed by a press surface having projections on regions corresponding to those provided with no conductor films. Thus, it is possible to readily apply stronger press actions only to specific regions of the laminate by employing the press surfaces having projections on specific regions.

In place of the aforementioned mode, a press action may be applied by a flat press surface in the preliminary pressing step in common for the first and second preliminary pressing steps. In this case, a pressure which is larger than that in the first preliminary pressing step is applied to the laminate in the second preliminary pressing step. When such pressing with a flat press surface is employed in common for the first and second preliminary pressing steps, it is possible to continuously carry out the first and second preliminary pressing steps by a common press machine, thereby improving efficiency of the preliminary pressing step.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3A shows a first preliminary pressing step, and FIG. 3B shows a second preliminary pressing step.

DESCRIPTION OF THE PREFERRED EMBODIMENTS

Figure 1:
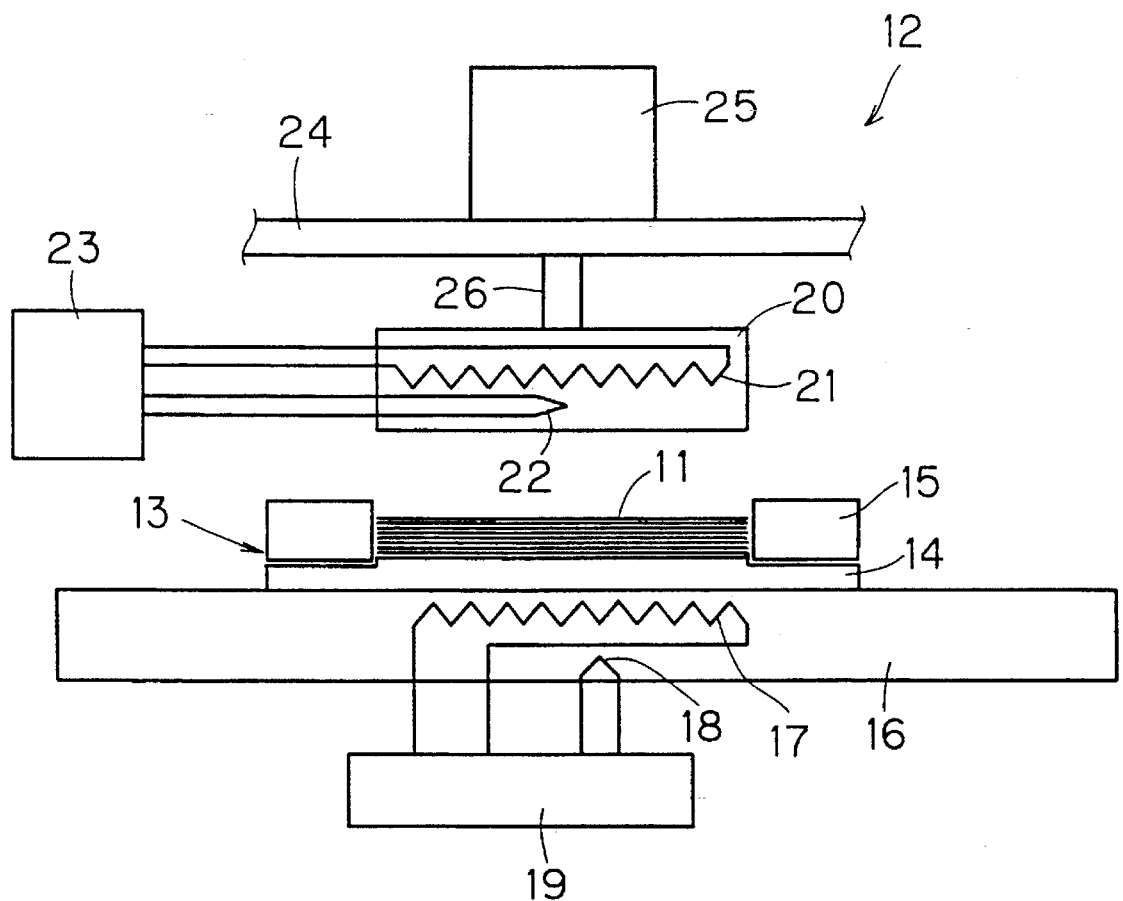
FIG. 1 is an illustrative sectional view showing a preliminary press machine 12 for carrying out a preliminary pressing step which is included in a method of manufacturing a multilayer ceramic electronic component according to an embodiment of the present invention.
Figure 2:
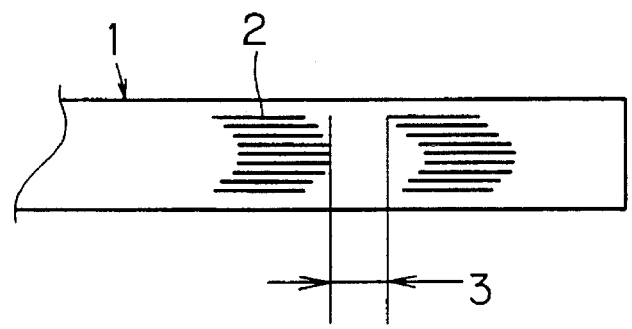
FIG. 2 is an illustrative sectional view showing a part of a laminate 1 passing through a pressing step, for illustrating problems to be solved by the present invention.

FIG. 1 is an illustrative sectional view showing an apparatus for carrying out a preliminary pressing step which is included in a method of manufacturing a multilayer ceramic electronic component according to an embodiment of the present invention. FIG. 1 illustrates a plurality of ceramic green sheets 11 which are stacked with each other. Specific ones of these ceramic green sheets 11 are provided with conductor films (not shown) for serving as internal electrodes, for example. While the conductor films are formed by applying metal paste onto the ceramic green sheets 11 by printing and thereafter drying the same as hereinabove described, the same may alternatively be formed by another method.

As shown in FIG. 1, a preliminary press machine 12 comprises a die 13 for positioning the aforementioned plurality of ceramic green sheets 11. The die 13 is formed by a base portion 14 and a frame portion 15. The frame portion 15 defines proper clearances between the same and the ceramic green sheets 11. The die 13 is set on a heating table 16. The heating table 16 contains a heater 17, to be heated by the same. A thermocouple 18 detects the temperature of the heating table 16, so that the temperature is controlled by a temperature controller 19.

On the other hand, a press head 20 is arranged to be opposed to the heating table 16. The press head 20 contains a heater 21, to be heated by the same. A thermocouple 22 detects the temperature of the press head 20, so that the temperature is controlled by a temperature controller 23. The press head 20 is held by a piston rod 26 extending from a cylinder 25 which is mounted on a fixed plate 24.

In the aforementioned preliminary press machine 12, the die 13 holding the plurality of ceramic green sheets 11 is set on the heating table 16 after the heating table 16 reaches a desired temperature. Alternatively, the heating table 16 may be heated after the die 13 holding the ceramic green sheets 11 is set on the same. The press head 20 is also set at a desired temperature. Then, the cylinder 25 is so driven that the press head 20 is downwardly moved to press the ceramic green sheets 11 which are held in the die 13. This is a preliminary pressing step which is carried out in advance of a main pressing step, and a pressure of 20 kgf/cm$^2$ is applied under a temperature of about 70° C. for about 30 seconds in this step, for example. Such preliminary pressing conditions are so adjusted that the plurality of stacked ceramic green sheets 11 are not separated from each other after this step.

A laminate obtained in the aforementioned preliminary pressing step is then subjected to the main pressing step (not shown), cut at need, and thereafter fired. After the firing, external electrodes etc. are applied at need, to obtain a desired multilayer ceramic electronic component.

While a press action is exerted on the overall surfaces of the ceramic green sheets 11 from the press head 20 in the preliminary pressing step of the aforementioned embodiment, such a press action may alternatively be applied to only regions provided with no conductor films.

Further, the cutting step which is carried out between the pressing step and the firing step depends on the mode of the multilayer ceramic electronic component to be obtained, and the present invention is also applicable to a manufacturing method including no such cutting step.

According to another embodiment of the present invention, a preliminary pressing step includes first and second preliminary pressing steps, to which different pressing conditions are applied.

Figure 3A:
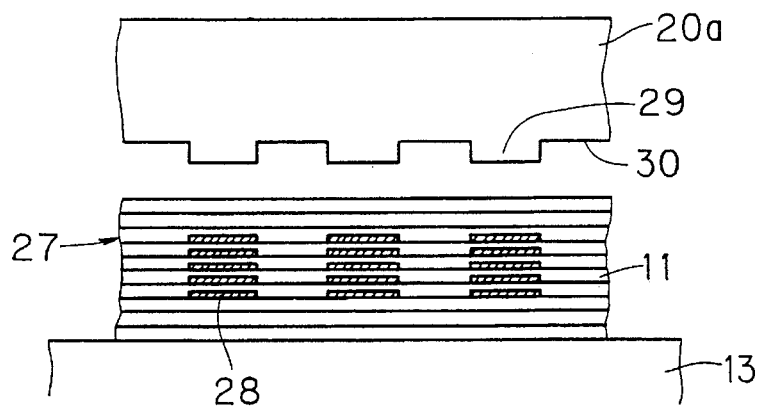
FIGS. 3A and 3B are sectional views for illustrating a preliminary pressing step which is included in a method of manufacturing a multilayer ceramic electronic component according to another embodiment of the present invention.
Figure 3B:
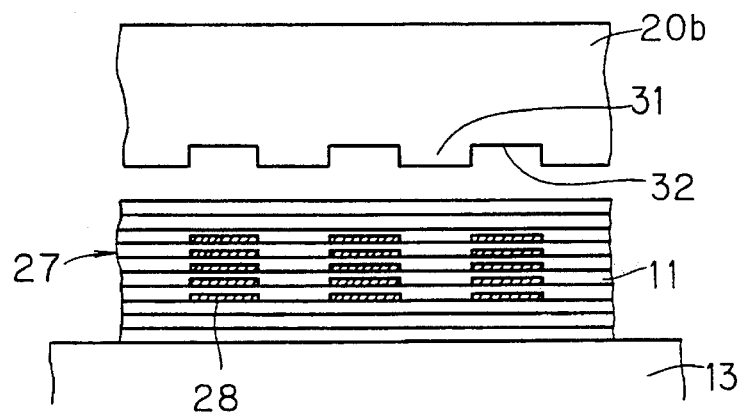

FIGS. 3A and 3B show the first and second preliminary pressing steps respectively. The first and second preliminary pressing steps are carried out by an apparatus which is substantially identical to the preliminary press machine 12 shown in FIG. 1. FIGS. 3A and 3B show a die 13 and press heads 20a and 20b corresponding to the die 13 and the press head 20 shown in FIG. 1 respectively. A part of a laminate 27 which is obtained by stacking a plurality of ceramic green sheets 11 is positioned in the die. 13, while specific ones of the plurality of ceramic green sheets 11 are provided with conductor films 28 for serving as internal electrodes, for example.

As shown in FIG. 3A, regions of the laminate 27 provided with the conductor films 28 are mainly pressed in the first preliminary pressing step, so that voids are removed from these regions. Therefore, the press head 20a comprising a press surface 30 having projections 29 on regions corresponding to those provided with the conductor films 28 is employed in this embodiment. According to the press head 20a having such a press surface 30, it is possible to further strongly exert a press action on the regions provided with the conductor films 28, thereby improving adhesion between the ceramic green sheets 11 while effectively removing voids which may exist in these regions. At least parts of the voids as removed may be moved to regions provided with no conductor films 28.

In the aforementioned first preliminary pressing step, a pressure of 5 to 30 kgf/cm$^2$ is applied at a temperature of 40° to 80° C. for 10 to 60 seconds, for example. Such pressing conditions are varied with the type of a binder contained in the ceramic green sheets 11, for example.

Then, the second preliminary pressing step is carried out as shown in FIG. 3B. In the second preliminary pressing step, at least regions of the laminate 27 provided with no conductor films 28 are pressed. Therefore, the press head 20b comprising a press surface 32 having projections 31 on regions corresponding to those provided with no conductor films 28 is employed in the second preliminary pressing step.

In the second preliminary pressing step, the pressure is increased to about 50 kgf/cm$^2$, for example, as compared with the aforementioned first preliminary pressing step, with application of a temperature of 40° to 80° C. Due to the second preliminary pressing step, adhesion between the ceramic green sheets 11 is improved at least in the regions provided with no conductor films 28, while voids existing therein are removed.

When the second preliminary pressing step is carried out following the first preliminary pressing step, adhesion is improved along the overall areas of the ceramic green sheets 11, while the voids are removed from the overall laminate 27.

After the aforementioned preliminary pressing step, the laminate 27 is subjected to a main pressing step (not shown), cut at need, and thereafter fired. After the firing, external electrodes etc. are applied at need, to obtain a desired multilayer ceramic electronic component.

Figure 4:
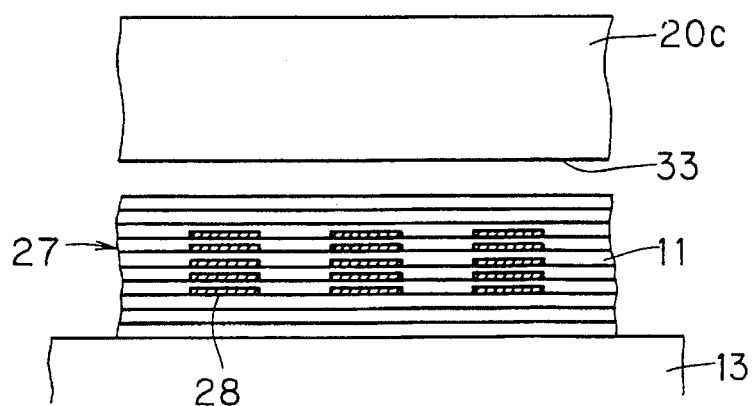
FIG. 4 is a sectional view corresponding to FIG. 3A or 3B, for illustrating still another embodiment of the present invention.

FIG. 4 is a sectional view corresponding to FIG. 3A or 3B, for illustrating still another embodiment of the present invention. Referring to FIG. 4, elements corresponding to those shown in FIG. 3A or 3B are denoted by similar reference numerals, to omit redundant description. FIG. 4 shows a press head 20c having a flat press surface 33. Pressing with such a flat press surface 33 can be applied to a first preliminary pressing step, a second preliminary pressing step, or both of the first and second preliminary pressing steps.

It is possible to apply pressing with the flat press surface 33 shown in FIG. 4 in the first preliminary pressing step shown in FIG. 3A or the second preliminary pressing step shown in FIG. 3B, for example. In these modes, particularly the latter mode is further preferably employed to carry out the first preliminary pressing step as shown in FIG. 3A while carrying out the second preliminary pressing step as shown in FIG. 4. It is easier to remove the voids from the regions provided with the conductor films 28 through application of pressing with the press surface 30 having the projections 29, while the pressure may be substantially uniformly applied to the overall area of the laminate 27 in the second preliminary pressing step.

As hereinabove described, pressing with the flat press surface 33 may be applied in the preliminary pressing step as shown in FIG. 4 in common for both of the first and second preliminary pressing steps, as hereinabove described. In this case, the first and second preliminary pressing steps are continuously carried out so that a pressure which is larger than that in the first preliminary pressing step is exerted on the laminate 27 in the second preliminary pressing step. For example, a pressure of 5 to 30 kgf/cm$^2$ is applied in the first preliminary pressing step, while that of about 50 kgf/cm$^2$ is applied in the second preliminary pressing step. In this case, the pressure as applied may be gradually increased as the operation is shifted from the first preliminary pressing step to the second preliminary pressing step.

The present invention is applicable to manufacturing of not only a multilayer ceramic capacitor but another multilayer ceramic electronic component such as a multilayer ceramic inductor or a ceramic multilayer circuit board, for example.

What is claimed is:

1. A method of manufacturing a multilayer ceramic electronic component, comprising the steps of:

stacking a plurality of ceramic green sheets being provided with conductor films with each other;

pressing a laminate as obtained along the direction of stacking; and thereafter firing said laminate, said pressing step including a preliminary pressing step and a main pressing step being carried out subsequently thereto, said preliminary pressing step including a step of pressing a major surface of said laminate under conditions of a temperature of at least 40° C. and a pressure of not more than 50 kgf/cm$^2$;

wherein said preliminary pressing step includes a first preliminary pressing step and a second preliminary pressing step being carried out subsequently thereto, regions of said laminate being provided with said conductor films being mainly pressed in said first preliminary pressing step so that voids are removed from said regions, at least regions of said laminate being provided with no said conductor films being mainly pressed in said second preliminary pressing step.

2. A method of manufacturing a multilayer ceramic electronic component in accordance with claim 1, wherein said temperature condition in said preliminary pressing step is selected in a range of 40° to 80° C.

3. A method of manufacturing a multilayer ceramic electronic component in accordance with claim 2, wherein said preliminary pressing step is carried out for 10 to 60 seconds.

4. A method of manufacturing a multilayer ceramic electronic component in accordance with claim 2, wherein said pressure condition in said preliminary pressing step is selected in a range of 5 to 30 kgf/cm$^2$.

5. A method of manufacturing a multilayer ceramic electronic component in accordance with claim 4, wherein said preliminary pressing step is carried out for 10 to 60 seconds.

6. A method of manufacturing a multilayer ceramic electronic component in accordance with claim 1, wherein said pressure condition in said preliminary pressing step is selected in a range of 5 to 30 kgf/cm$^2$.

7. A method of manufacturing a multilayer ceramic electronic component in accordance with claim 6, wherein said preliminary pressing step is carried out for 10 to 60 seconds.

8. A method of manufacturing a multilayer ceramic electronic component in accordance with claim 1, wherein said preliminary pressing step is carried out for 10 to 60 seconds.

9. A method of manufacturing a multilayer ceramic electronic component in accordance with claim 1, wherein said laminate is pressed by a press surface having projections on regions corresponding to said regions provided with said conductor films in said first preliminary pressing step.

10. A method of manufacturing a multilayer ceramic electronic component in accordance with claim 1, wherein said laminate is pressed by a press surface having projections on regions corresponding to said regions provided with no said conductor films in said second preliminary pressing step.

11. A method of manufacturing a multilayer ceramic electronic component in accordance with claim 1, wherein said laminate is pressed by a press surface having projections on regions corresponding to said regions provided with said conductor films in said first preliminary pressing step, and said laminate is pressed by a press surface having projections on regions corresponding to said regions provided with no said conductor films in said second preliminary pressing step.

12. A method of manufacturing a multilayer ceramic electronic component in accordance with claim 11, wherein a pressure condition in said first preliminary pressing step is selected in a range of 5 to 30 kgf/cm$^2$, and that in said second preliminary pressing step is selected at about 50 kgf/cm$^2$.

13. A method of manufacturing a multilayer ceramic electronic component in accordance with claim 1, wherein pressing with a flat press surface is applied in said preliminary pressing step in common for said first and second preliminary pressing steps, a pressure being larger than that in said first preliminary pressing step being applied to said laminate in said second preliminary pressing step.

14. A method of manufacturing a multilayer ceramic electronic component in accordance with claim 13, wherein a pressure condition in said first preliminary pressing step is selected in a range of 5 to 30 kgf/cm$^2$, and that in said second preliminary pressing step is selected at about 50 kgf/cm$^2$.

* * * * *